(12) United States Patent
Chou et al.

(10) Patent No.: US 11,881,527 B2
(45) Date of Patent: Jan. 23, 2024

(54) LATERAL DIFFUSION METAL-OXIDE SEMICONDUCTOR DEVICE

(71) Applicant: UNITED MICROELECTRONICS CORP., Hsin-Chu (TW)

(72) Inventors: Ling-Chun Chou, Tainan (TW); Yu-Hung Chang, Tainan (TW); Kun-Hsien Lee, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/472,680

(22) Filed: Sep. 12, 2021

(65) Prior Publication Data

US 2023/0052714 A1 Feb. 16, 2023

(30) Foreign Application Priority Data

Aug. 16, 2021 (CN) .......................... 202110935538.1

(51) Int. Cl.
*H01L 29/78* (2006.01)
*H01L 29/06* (2006.01)

(52) U.S. Cl.
CPC ...... *H01L 29/7823* (2013.01); *H01L 29/0623* (2013.01)

(58) Field of Classification Search
CPC ......... H01L 29/7823; H01L 29/66681–66704; H01L 29/7816–7826; H01L 29/0619–0623; H01L 29/7831–7832; H01L 21/823437–823456; H01L 21/823842; H01L 29/0843–0891; H01L 29/66636–66643
See application file for complete search history.

(56) References Cited

U.S. PATENT DOCUMENTS

| | | | |
|---|---|---|---|
| 10,763,800 B2 * | 9/2020 | Ji | .......................... H02M 3/285 |
| 2005/0112822 A1 | 5/2005 | Litwin | |
| 2006/0278924 A1 * | 12/2006 | Kao | ..................... H01L 29/7816 257/E29.021 |
| 2012/0205738 A1 | 8/2012 | Yang et al. | |
| 2017/0018612 A1 * | 1/2017 | Ito | ..................... H01L 29/42368 |
| 2019/0259875 A1 * | 8/2019 | Li | ........................ H01L 29/7816 |
| 2019/0386117 A1 * | 12/2019 | Lee | ..................... H01L 29/0634 |
| 2020/0066743 A1 * | 2/2020 | Furukawa | ........... H01L 29/0619 |

* cited by examiner

*Primary Examiner* — Shahed Ahmed
(74) *Attorney, Agent, or Firm* — Winston Hsu

(57) ABSTRACT

A lateral diffusion metal-oxide semiconductor (LDMOS) device includes a first gate structure and a second gate structure extending along a first direction on a substrate, a first source region extending along the first direction on one side of the first gate structure, a second source region extending along the first direction on one side of the second gate structure, a drain region extending along the first direction between the first gate structure and the second gate structure, a guard ring surrounding the first gate structure and the second gate structure, and a shallow trench isolation (STI) surrounding the guard ring.

6 Claims, 4 Drawing Sheets

LATERAL DIFFUSION METAL-OXIDE SEMICONDUCTOR DEVICE

BACKGROUND OF THE INVENTION

1. Field of the Invention

The invention relates to a lateral diffusion metal-oxide semiconductor (LDMOS) device, and more particularly, to a LDMOS device having a guard ring surrounding gate structure.

2. Description of the Prior Art

Having the advantages of a high operational bandwidth, a high operational efficiency, and a planar structure that eases the integration in other integrated circuits, lateral double-diffused metal-oxide-semiconductor (LDMOS) transistor devices are widely used in high operational voltage environments such as CPU power supplies, power management systems, AC/DC converters, and high-power or high frequency (HF) band power amplifiers.

However, current LDMOS devices are often too large in areas that made on-state breakdown voltage and compatibility unsatisfactory. Hence how to improve the current design of LDMOS devices has become an important task in this field.

SUMMARY OF THE INVENTION

According to an embodiment of the present invention, a lateral diffusion metal-oxide semiconductor (LDMOS) device includes a first gate structure and a second gate structure extending along a first direction on a substrate, a first source region extending along the first direction on one side of the first gate structure, a second source region extending along the first direction on one side of the second gate structure, a drain region extending along the first direction between the first gate structure and the second gate structure, a guard ring surrounding the first gate structure and the second gate structure, and a shallow trench isolation (STI) surrounding the guard ring.

According to another aspect of the present invention, a lateral diffusion metal-oxide semiconductor (LDMOS) device includes a first gate structure and a second gate structure extending along a first direction on a substrate, a first source region extending along the first direction on one side of the first gate structure, a second source region extending along the first direction on one side of the second gate structure, a drain region extending along the first direction between the first gate structure and the second gate structure, a first guard region connecting the first source region and the second source region on one side of the first gate structure and the second gate structure, and a second guard region connecting the first source region and the second source region on another side of the first gate structure and the second gate structure.

According to yet another aspect of the present invention, a lateral diffusion metal-oxide semiconductor (LDMOS) device includes a first gate structure and a second gate structure extending along a first direction on a substrate, a first source region extending along the first direction on one side of the first gate structure, a second source region extending along the first direction on one side of the second gate structure, a drain region extending along the first direction between the first gate structure and the second gate structure, a guard ring surrounding the first gate structure and the second gate structure, guard portions connecting the first source region, the second source region, and the guard ring, and a shallow trench isolation (STI) surrounding the guard ring.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
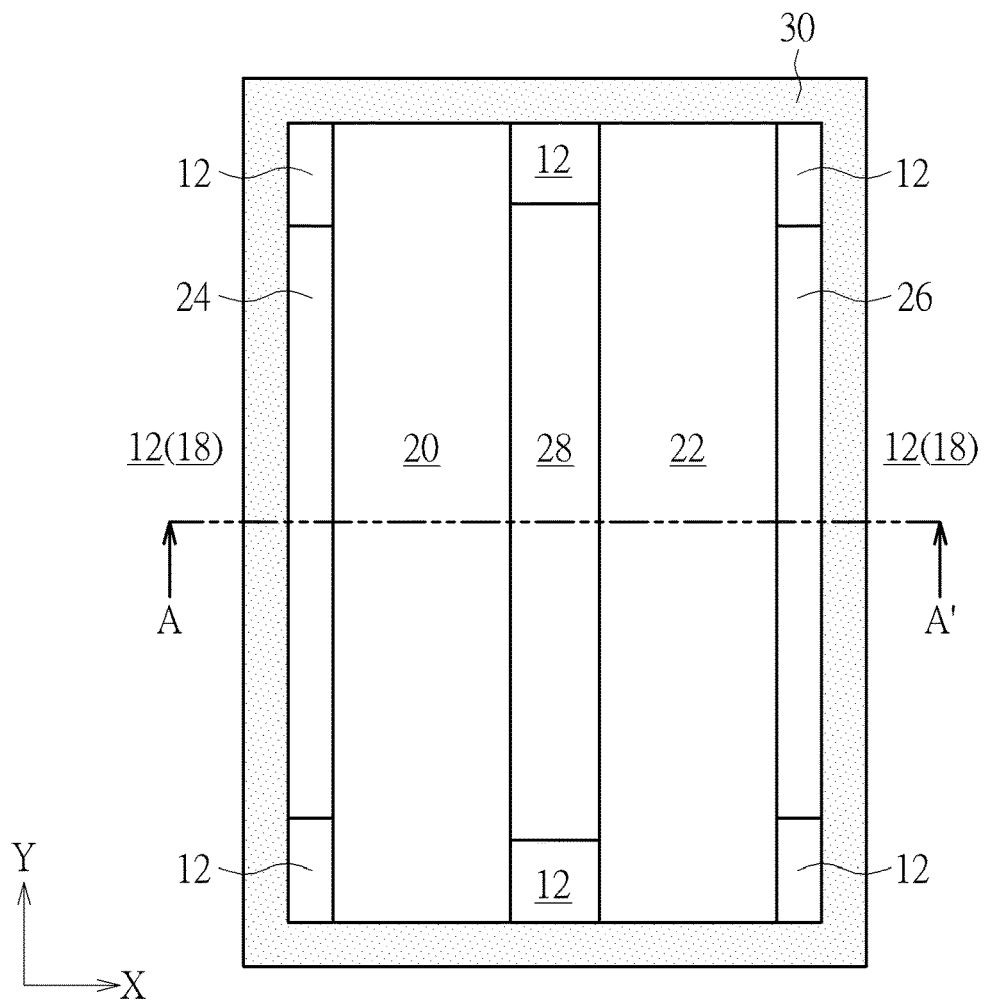
FIG. 1 illustrates a top view of a LDMOS device according to an embodiment of the present invention.
Figure 2:
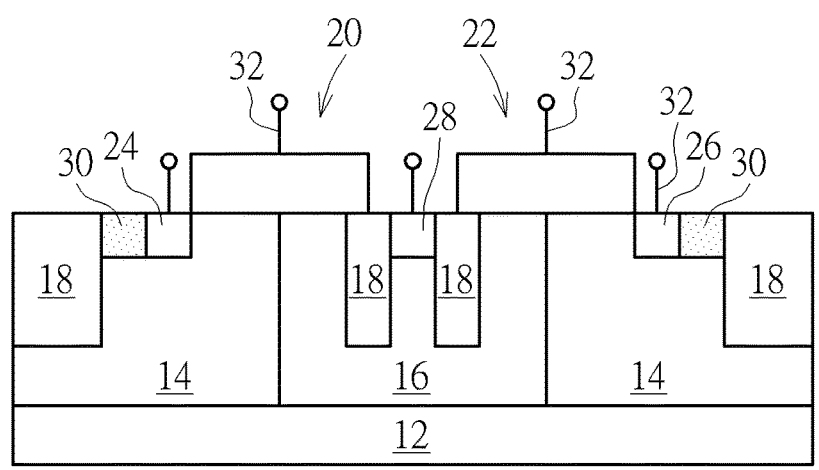
FIG. 2 illustrates a cross-section view of FIG. 1 taken along the sectional line AA'.

Referring to FIGS. 1-2, FIGS. 1-2 illustrate a method for fabricating a LDMOS device according to an embodiment of the present invention, in which FIG. 1 illustrates a top view of the LDMOS device and FIG. 2 illustrates a cross-section view of FIG. 1 taken along the sectional line AA'. As shown in FIG. 1, a substrate 12 is first provided and a first well (such as p-well 14), a second well (such as n-well 16), and a shallow trench isolation (STI) 18 are formed in the substrate 12. In this embodiment, the substrate 12 is preferably made of semiconductor material such as a silicon substrate, an epitaxial substrate, a SiC substrate, or a silicon-on-insulator (SOI) substrate and the shallow trench isolation (STI) 18 is preferably made of silicon oxide, but not limited thereto.

Next, a gate structure 20 is formed on the left substrate 12 and the STI 18 and a gate structure 22 is formed on the right substrate 12 and the STI 18, in which the gate structure 20 is disposed on part of the n-well 16 and the p-well 14 on the left while the gate structure 22 is disposed part of the n-well 16 and the p-well 14 on the right. In this embodiment, the formation of the gate structures 20, 22 could be accomplished by a gate first process, a high-k first approach from gate last process, or a high-k last approach from gate last process. Since this embodiment pertains to a gate first approach, a gate dielectric layer or interfacial layer, a gate material layer, and a selective hard mask could be formed sequentially on the substrate 12, and a pattern transfer process is then conducted by using a patterned resist (not shown) as mask to remove part of the gate material layer and part of the gate dielectric layer through single or multiple etching processes. After stripping the patterned resist, gate structures 20, 22 each composed of a patterned gate dielectric layer and a patterned gate material layer are formed on the substrate 12.

Next, at least a spacer (not shown) is formed on the sidewalls of each of the gate structures 20, 22, source regions 24, 26 made of n+ regions, a drain region 28 made of a n+ region, and a guard ring 30 made of a p+ region are formed in the substrate 12 adjacent to two sides of the gate structures 20, 22, in which the source region 24 is disposed on left side of the gate structure 20, the source region 26 is disposed on right side of the gate structure 22, the drain region 28 is disposed between the gate structures 20, 22, and the guard ring 30 under the cross-section view is disposed on left side of the gate structure 20 and right side of the gate structure 22 and immediately adjacent to the source regions 24, 26. Next, a selective salicide process could be conducted to form a silicide layer (not shown) on surfaces of the source regions 24, 26, the drain region 28, and the guard ring 30.

In this embodiment, the spacer could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The source regions 24, 26, the drain region 28, and the guard ring 30 could include n-type dopants or p-type dopants depending on the type of device being fabricated.

Next, an interlayer dielectric (ILD) layer (not shown) is formed on the gate structures 20, 22 and a photo-etching process is conducted by using a patterned mask (not shown) as mask to remove part of the ILD layer adjacent to the gate structures 20, 22 for forming contact holes (not shown) exposing the gate structures 20, 22, the source regions 24, 26, and the drain region 28. Next, conductive materials including a barrier layer selected from the group consisting of titanium (Ti), titanium nitride (TiN), tantalum (Ta), and tantalum nitride (TaN) and a metal layer selected from the group consisting of tungsten (W), copper (Cu), aluminum (Al), titanium aluminide (TiAl), and cobalt tungsten phosphide (CoWP) are deposited into the contact holes, and a planarizing process such as chemical mechanical polishing (CMP) is conducted to remove part of aforementioned barrier layer and metal layer for forming contact plugs 32 electrically connecting the gate structures 20, 22, the source regions 24, 26, and the drain region 28. This completes the fabrication of a semiconductor device according to an embodiment of the present invention.

It should be noted that even though the contact plugs 32 are only disposed on the gate structures 20, 22, the source regions 24, 26, and the drain region 28 but not on the guard ring 30 in this embodiment, according to other embodiment of the present invention it would also be desirable to form contact plugs 32 directly contacting the guard ring 30, which is also within the scope of the present invention. Moreover, even though the present embodiment pertains to the fabrication of polysilicon gates made from gate first approach, according to other embodiment of the present invention it would also be desirable to conduct a replacement metal gate (RMG) process to transform the polysilicon gates into metal gates each containing elements such as an interfacial layer, a high-k dielectric layer, one or more work function metal layers, and a low resistance metal layer.

If the gate structures were made of metal gates, the high-k dielectric layer is preferably selected from dielectric materials having dielectric constant (k value) larger than 4. For instance, the high-k dielectric layer may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

The work function metal layer would be formed for tuning the work function of the later formed metal gates to be appropriate in an NMOS or a PMOS. For an NMOS transistor, the work function metal layer having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer and the low resistance metal layer, in which the material of the barrier layer may include titanium (Ti), titanium nitride (TiN), tantalum (Ta) or tantalum nitride (TaN). Furthermore, the material of the low-resistance metal layer may include copper (Cu), aluminum (Al), titanium aluminum (TiAl), cobalt tungsten phosphide (CoWP) or any combination thereof. Since the process of using RMG process to transform dummy polysilicon gates into metal gates is well known to those skilled in the art, the details of which are not explained herein for the sake of brevity.

Referring again to FIG. 1, as shown in the top view of FIG. 1, the gate structures 20, 22 are disposed extending along a first direction such as Y-direction on the substrate 12, the source region 24 is disposed extending along the Y-direction on one side such as left side of the gate structure 20, the source region 26 is disposed extending along the Y-direction on one side such as right side of the gate structure 22, the drain region 28 is disposed extending along the Y-direction between the gate structures 20, 22, the guard ring 30 is disposed surrounding the gate structures 20, 22, and the STI 18 is disposed surrounding the entire guard ring 30. In this embodiment, the guard ring 30 is disposed outside the source regions 24, 26 and surrounding the source regions 24, 26, the drain region 28, and the gate structures 20, 22, in which the guard ring 30 preferably contacts the source regions 24, 26 adjacent to two sides of the gate structures 20, 22 directly but not contacting the drain region 28. It should be noted that for simplicity purpose, sidewalls of the gate structures 20, 22 are shown to directly contact and aligned with sidewalls of the drain region 28, nevertheless according to other embodiment of the present invention, the sidewalls of the gate structures 20, 22 could also be formed not aligning to the sidewalls of the drain region 28 as shown in the cross-section view of FIG. 2, which is also within the scope of the present invention.

Figure 3:
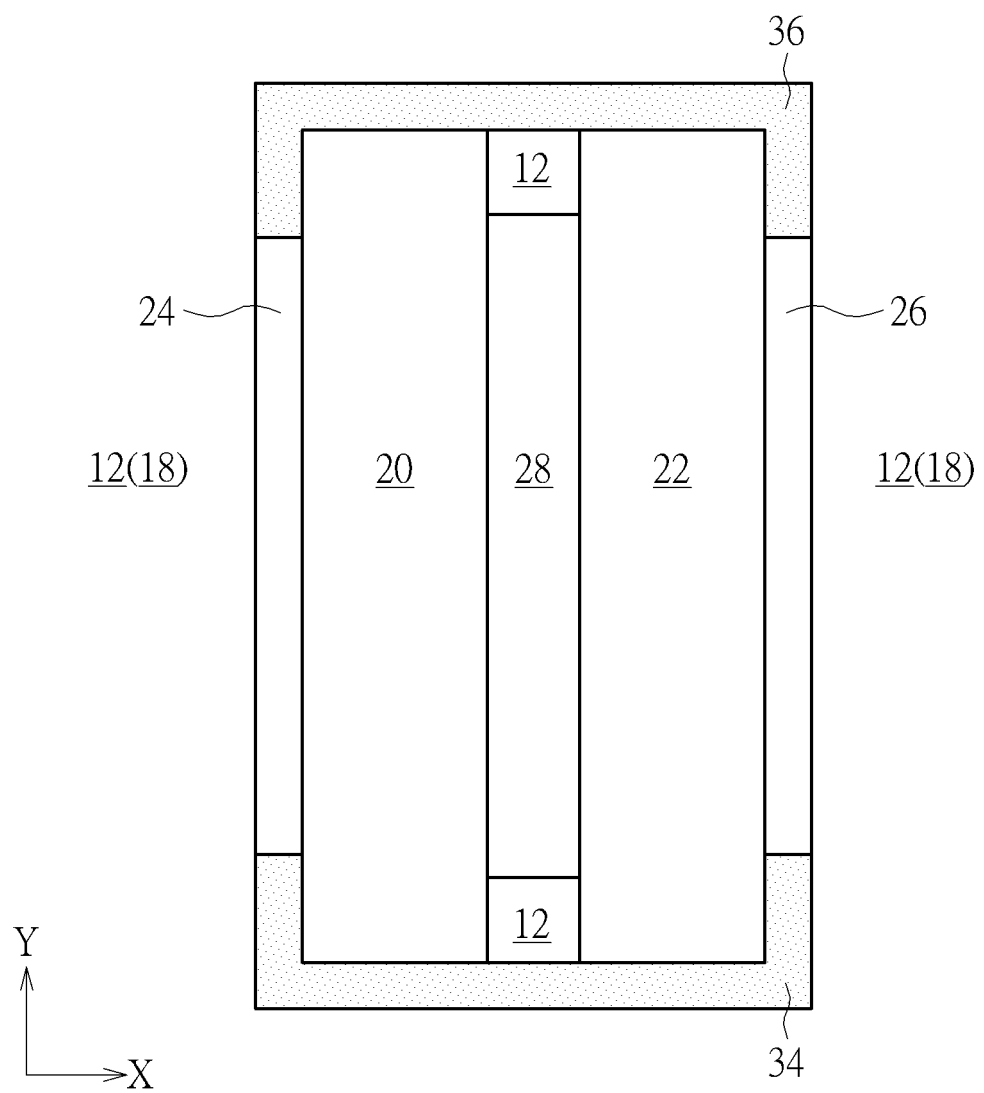
FIG. 3 illustrates a top view of a LDMOS device according to an embodiment of the present invention.

Referring to FIG. 3, FIG. 3 illustrates a top view of a LDMOS device according to an embodiment of the present invention. As shown in FIG. 3, the LDMOS device preferably includes gate structures 20, 22 disposed extending along a first direction such as Y-direction on the substrate 12, a source region 24 disposed extending along the Y-direction on one side such as left side of the gate structure 20, a source region 26 disposed extending along the Y-direction on one side such as right side of the gate structure 22, a drain region 28 disposed extending along the Y-direction between the gate structures 20, 22, a guard region 34 connecting the source regions 24, 26 on one side of the gate structures 20, 22, and a guard region 36 connecting the source regions 24, 26 on another side of the gate structures 20, 22. Similar to the aforementioned embodiment, even though sidewalls of the gate structures 20, 22 are shown to directly contact and aligned with sidewalls of the drain region 28, according to other embodiment of the present invention the sidewalls of the gate structures 20, 22 could also be formed not aligning with the sidewalls of the drain region 28 as shown in FIG. 2, which is also within the scope of the present invention.

In this embodiment, the guard region 34 disposed on one side or bottom side of the gate structures 20, 22 preferably includes a substantially U-shape profile connecting the source regions 24, 26 under a top view perspective while the guard region 36 disposed on another side or top side of the gate structures 20, 22 includes a reverse U-shape profile connecting the source regions 24, 26 under the top view perspective. Preferably, each of the guard regions 34, 36 contacts the source regions 24, 26 directly and two edges or sides of the guard regions 34, 36 are also aligned with two edges or sides of the source regions 24, 26. Similar to the aforementioned embodiment, each of the source regions 24, 26 and the drain region 28 includes a n+ region while the guard regions 34, 36 include p+ regions.

Figure 4:
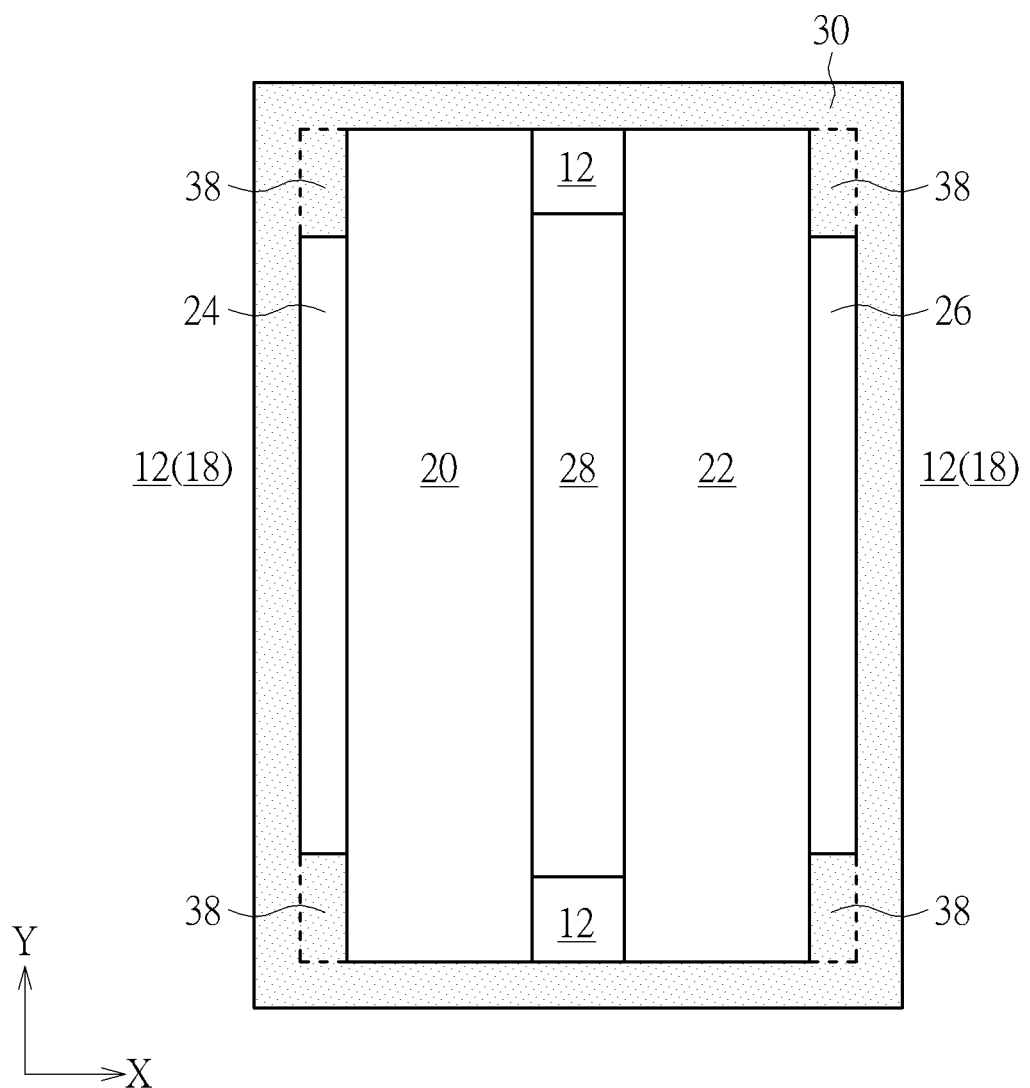
FIG. 4 illustrates a top view of a LDMOS device according to an embodiment of the present invention.

Referring to FIG. 4, FIG. 4 illustrates a top view of a LDMOS device according to an embodiment of the present invention. As shown in FIG. 4, the LDMOS device preferably includes gate structures 20, 22 disposed extending along a first direction such as Y-direction on the substrate 12, a source region 24 disposed extending along the Y-direction on one side such as left side of the gate structure 20, a source region 26 disposed extending along the Y-direction on one side such as right side of the gate structure 22, a drain region 28 disposed extending along the Y-direction between the gate structures 20, 22, a guard ring 30 surrounding the gate structures 20, 22, a plurality of guard regions 38 connecting the source regions 24, 26 and the guard ring 30, and a STI 18 surrounding the guard ring 30. Similar to the aforementioned embodiment, even though sidewalls of the gate structures 20, 22 are shown to directly contact and aligned with sidewalls of the drain region 28, according to other embodiment of the present invention the sidewalls of the gate structures 20, 22 could also be formed not aligning with the sidewalls of the drain region 28 as shown in FIG. 2, which is also within the scope of the present invention.

Similar to the embodiment shown in FIG. 1, the guard ring 30 in this embodiment is disposed outside the source regions 24, 26 and surrounding the source regions 24, 26, the drain region 28, and the gate structures 20, 22, in which the guard ring 30 directly contacts the source regions 24, 26 adjacent to two sides of the gate structures 20, 22 without contacting the drain region 28 directly. The guard regions 38 on the other hand are disposed on four corners of the guard ring 30 and contacting the guard ring 30 and the source regions 24, 26 directly. In other word, the structure disclosed in this embodiment is a combined variation of the guard ring and guard regions shown in FIGS. 1 and 3. It should be noted that even though the guard ring 30 and the guard regions 38 are divided by dash lines, the two elements are in fact same structure fabricated from the same process. Similar to the aforementioned embodiment, each of the source regions 24, 26 and the drain region 28 includes a n+ region while each of the guard ring 30 and guard regions 38 includes a p+ region.

Figure 5:
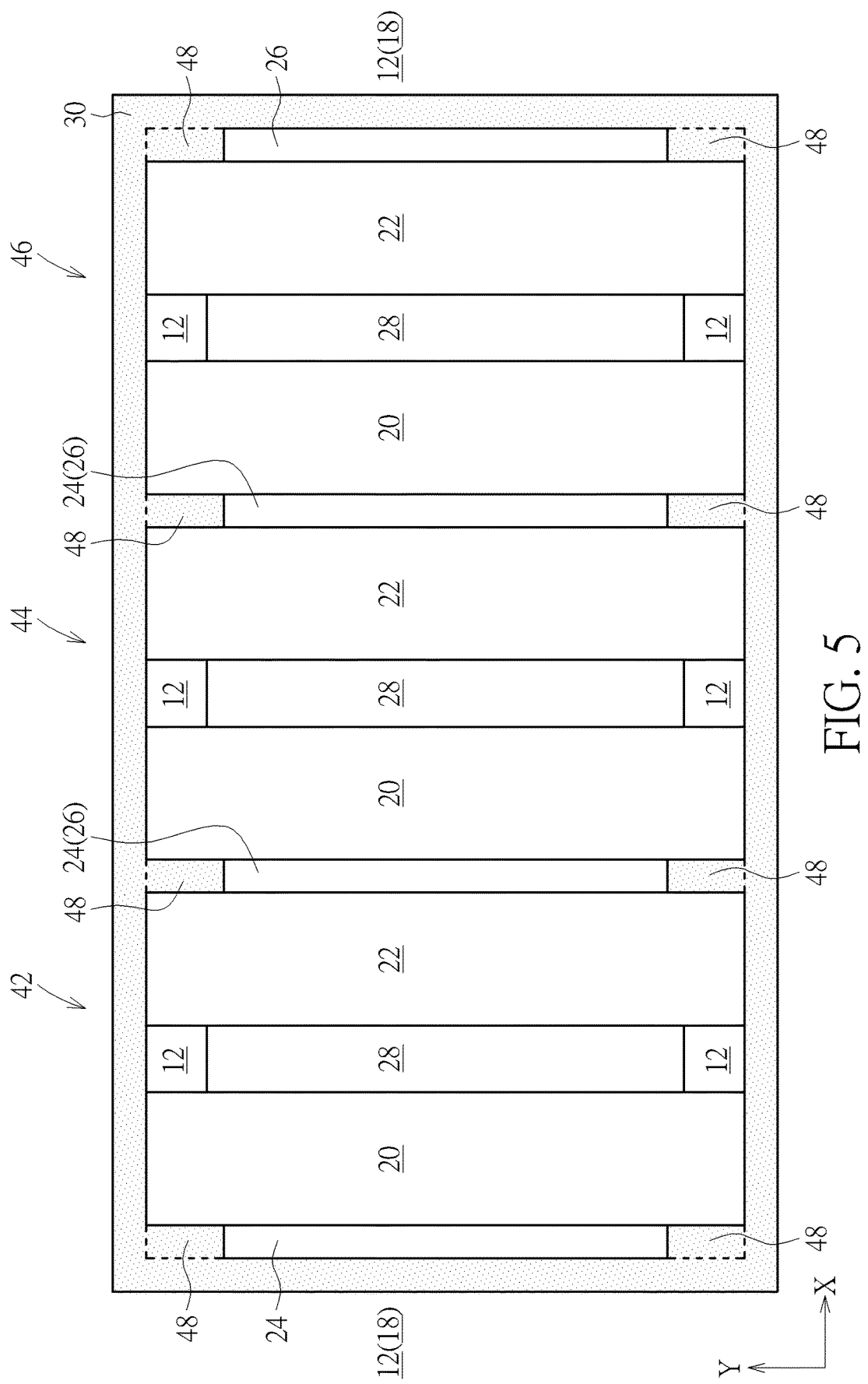
FIG. 5 illustrates a top view of a LDMOS device according to an embodiment of the present invention.

Referring to FIG. 5, FIG. 5 illustrates a top view of a LDMOS device according to an embodiment of the present invention. As shown in FIG. 5, the LDMOS device preferably includes three sets of LDMOS devices 42, 44, 46 or three sets of LDMOS units disposed on the substrate 12, in which the three sets of LDMOS devices 42, 44, 46 are disposed immediately adjacent to each other and each of the LDMOS devices 42, 44, 46 includes all of the elements disclosed in the aforementioned embodiments.

For instance, each of the LDMOS devices 42, 44, 46 includes gate structures 20, 22 disposed extending along a first direction such as Y-direction on the substrate 12, a source region 24 disposed extending along the Y-direction on one side such as left side of the gate structure 20, a source region 26 disposed extending along the Y-direction on one side such as right side of the gate structure 22, and a drain region 28 disposed extending along the Y-direction between the gate structures 20, 22. It should be noted that the source regions disposed between two adjacent LDMOS devices 42, 44, 46 preferably serve as common source regions for the LDMOS devices on two adjacent sides. For instance, the source region 24 or 26 between the LDMOS devices 42, 44 and the source region 24 or 26 between the LDMOS devices 44 and 46 are preferably common source regions.

Moreover, the LDMOS device of this embodiment also includes a guard ring 30 surrounding the three sets of LDMOS devices 42, 44, 46 at the same time, a plurality of guard regions 48 connecting the source regions 24, 26 and the guard ring 30, and a STI 18 surrounding the guard ring 30, in which the guard ring 30 preferably contacts the source regions 24, 26 adjacent to two sides of the entire LDMOS devices 42, 46 directly without contacting the drain region 28 directly.

Specifically, the guard ring 30 contacts the source region 24 on left side of the LDMOS deice 42 and the source region 26 on right side of the LDMOS device 46 without contacting the drain region 28 and the guard regions 48 further include eight guard regions, in which four of the guard regions 48 are disposed on four corners of the guard ring 30 and contacting the guard ring 30 and source regions 24, 26 directly while the remaining four guard regions 48 are disposed to connect the guard ring 30 and source regions 24, 26 adjacent to two sides of the LDMOS device 44 in the middle. Similar to the aforementioned embodiment, even though the guard ring 30 and the guard regions 48 are divided by dash lines, the two elements are in fact same structure or structure formed in unity as the two elements are fabricated from the same process.

Overall, the present invention discloses at least three layouts of LDMOS devices shown in FIGS. 1, 3, and 4 that principally forms structures such as a guard ring and/or guard regions surrounding gate structures, source regions, and drain regions for reducing overall area of p-type units in particular of each of the LDMOS devices. According to a preferred embodiment of the present invention, by placing the aforementioned guard ring and/or guard regions outside the source region and immediately adjacent to or directly contacting the source regions, it would be desirable to lower the overall unit area of current LDMOS device and at the same time improve on-state breakdown voltage and compatibility of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A lateral diffusion metal-oxide semiconductor (LDMOS) device, comprising:
   a first gate structure and a second gate structure extending along a first direction on a substrate;
   a first source region extending along the first direction on one side of the first gate structure, wherein a length of a sidewall of the first source region directly contacting a sidewall of the first gate structure is less than a length of the sidewall of the first gate structure directly contacting the first source region under a top view perspective;

a second source region extending along the first direction on one side of the second gate structure;

a drain region extending along the first direction between the first gate structure and the second gate structure;

a guard ring surrounding the first gate structure and the second gate structure under a top view perspective, wherein the guard ring directly contacts sidewalls of the first gate structure and the second gate structure extending along a second direction but not contacting sidewalls of the first gate structure and the second gate structure extending along the first direction; and a shallow trench isolation (STI) surrounding the guard ring.

2. The LDMOS device of claim 1, wherein the first source region comprises a N+ region.

3. The LDMOS device of claim 1, wherein the second source region comprises a N+ region.

4. The LDMOS device of claim 1, wherein the drain region comprises a N+ region.

5. The LDMOS device of claim 1, wherein the guard ring comprises a P+ region.

6. The LDMOS device of claim 1, wherein the guard ring contacts the first source region directly.

* * * * *